United States Patent [19]

Heimann

[11] 4,359,488

[45] Nov. 16, 1982

[54] METHOD OF PRODUCING A DOUBLE LAYER HAVING A HETERO-JUNCTION FOR A STORAGE ELECTRODE OF A CAMERA DEVICE

[75] Inventor: Bernd Heimann, Wiesbaden, Fed. Rep. of Germany

[73] Assignee: Heimann GmbH, Wiesbaden, Fed. Rep. of Germany

[21] Appl. No.: 212,367

[22] Filed: Dec. 3, 1980

[30] Foreign Application Priority Data

Dec. 20, 1979 [DE] Fed. Rep. of Germany ....... 2951482

[51] Int. Cl.[3] ........................ H01L 31/18; B05D 1/38

[52] U.S. Cl. .................................. 427/76; 252/501.1; 428/697; 428/701

[58] Field of Search ....................... 427/76; 252/501.1; 428/697, 701

[56] References Cited

PUBLICATIONS

"Fernseh-Und Kino-Technik", vol. 32, No. 9/1978, pp. 341–348.

*Primary Examiner*—James R. Hoffman

*Attorney, Agent, or Firm*—Hill, Van Santen, Steadman, Chiara & Simpson

[57] ABSTRACT

A double layer having a hetero-junction interface for a storage electrode of an electro-optical camera device is produced by vacuum vapor deposition of n-conductive cadmium selenide or cadmium sulfo-selenide onto a $n^+$-conductive signal electrode layer comprised of tin oxide. The cadmium material to be vapor deposited is admixed with a small amount of a glass additive, such as boron oxide, the admixture sintered in vacuum and thereafter the cadmium material is vapor-deposited onto the signal electrode without spattering. The resultant hetero-junction is substantially free of metallic cadmium and such double layer is particularly useful in a Vidicon target.

12 Claims, No Drawings

METHOD OF PRODUCING A DOUBLE LAYER HAVING A HETERO-JUNCTION FOR A STORAGE ELECTRODE OF A CAMERA DEVICE

BACKGROUND OF THE INVENTION

1. Field of the Invention

The invention relates to producing a double layer having a hetero-junction which is useful as a storage electrode of an electro-optical camera means and somewhat more particularly to an improved method of producing such a double layer which is characterized by:

(a) a first layer comprised of a transparent semiconductor material having $n^+$-conductivity and functioning as an electrically conductive signal electrode;

(b) a second layer composed of a photo-conductive cadmium selenide or cadmium sulfo-selenide having n-conductivity; and (c) the second layer being produced by vacuum vapor deposition onto the first layer.

2. Prior Art

The manufacture of a so-called hetero-barrier layer target for an electro-optical camera tube is known, for example, from the publication "Fernseh-Und Kino-Technik" (Television and Cinematographic Technology), Vol. 32, No. 9/1978, pages 341–348. This publication suggests, at page 348, that a layer composed of n-conductive cadmium selenide be vacuum vapor-deposited onto a transparent, conductive layer composed of tin oxide. This publication defines a hetero-barrier as being the junction or interface between one or two additionally applied layers to the second layer already mentioned. However, a hetero-junction also exists between a $n^+$-conductive tin oxide layer functioning as the signal electrode and a n-conductive semiconductor layer of another material vapor-deposited thereon. Such a junction is necessary to prevent the injection of holes from the signal electrode into the photo-conductive layer or, essentially equivalently, to prevent an electron current in the opposite direction. Both would result in an undesired temperature-dependent dark current, i.e., an electrical signal without light incidence. The dark current and its temperature dependency can be kept very low by the last described hetero-junction in addition to the earlier described hetero barrier-layer in a completed target of a camera tube means.

In order to prevent a camera device from exhibiting image errors in the form of white spots or the like, a homogeneous structure of the photo-conductive layer is required.

SUMMARY OF THE INVENTION

The invention provides a method of producing a double layer with a hetero-junction whereby a homogeneous structure for the photo-conductive layer thereof is attained, as well as a target means containing such double layer for a camera device.

In accordance with the principles of the invention, the earlier described process of depositing a first layer composed of a transparent semiconductor material having $n^+$-conductivity and functioning as an electrically conductive signal electrode of a camera tube means on a suitable substrate and depositing by a vacuum evaporating process, a second layer consisting of a photo-conductive cadmium selenide or cadmium sulfo-selenide having n-conductivity onto the free surface of the first layer is improved by (1) adding at least one glass additive material, preferably composed of boron oxide, to the cadmium material to be vapor-deposited and sintering the resultant mixture in vacuum so as to prevent any metallic cadmium generated during sintering from precipitating onto the free surface of the first layer, such as by conducting the sintering at a temperature ranging between about 750° C. to 850° C. and initiating vacuum vapor-deposition of the cadmium material at a temperature in the range of about 700° C. to 750° C. or by conducting the sintering in a first system under vacuum at a select temperature and conducting the vapor-deposition of the cadmium material at a temperature in the range of about 700° C. to 750° C. in a second system under vacuum and separated from the first system.

DESCRIPTION OF PREFERRED EMBODIMENTS

The invention provides a method of producing a double layer having a hetero-junction for use in a camera device, along with a target means having such double layer for a camera device.

In accordance with the principles of the invention, a substantially homogeneous photo-conductive layer is deposited onto a transparent semiconductor layer so that a hetero-junction is achieved between these layers. Such a double layer structure is produced by depositing a first layer consisting of a transparent semiconductor material having $n^+$-conductivity, such as antimony-doped tin oxide, onto a suitable substrate, i.e., a glass pane, admixing a cadmium material, such as selected from the group consisting of cadmium selenide and cadmium sulfo-selenide, with a glass additive material, such as boron oxide, sintering the resultant admixture in vacuum at a select temperature so as to prevent metallic cadmium from precipitating onto a free surface of the first layer such as by conducting the sintering at a temperature ranging between about 750° C. to 850° C. or by conducting the sintering in a separate system from the vapor deposition system and thereafter initiating vapor deposition of the so-treated cadmium material onto the free surface of the first layer by a vacuum evaporation process at temperatures ranging between about 700° to 750° C.

By proceeding in accordance with the principles of the invention, the powder-like cadmium material which is to be vapor-deposited, first sinters together due to the thermal treatment and any gas inclusions that may have been present are eliminated. Further, during this thermal treatment, the glass additive material melts. This substantially reduces the tendency of the cadmium material to spatter. In this manner, the vaporizable material (i.e., cadmium selenide or cadmium sulfo-selenide), can be vacuum vapor-deposited as a homogeneous second layer on the first layer. The metallic cadmium which may be generated during the thermal treatment (i.e., sintering) due to the decomposition of cadmium selenide or cadmium sulfo-selenide, must be kept away from the first layer because its presence would reduce the blocking ability of the later obtained hetero-junction. This is accomplished, for example, by regulating the temperature of the thermal treatment so that it does not exceed the upper maximum limit of 850° C. Alternatively, the thermal treatment can be undertaken in a separate system from the vapor deposition system. However, the thermally treated cadmium material must not be exposed to a gas atmosphere (such as an oxygencontaining atmosphere) between the thermal treatment and the vapor-deposition.

In a preferred embodiment of the invention, the thermal treatment occurs at about 800° C. In this manner the desired sintering is achieved without generating metallic cadmium in an undesirable amount.

In a preferred embodiment of the invention, the glass additive material is added in amounts ranging between about 0.1 to 1 weight percent, based on the total weight of the material being vapor-deposited.

In a preferred embodiment of the invention, the free surface of the first layer, which is to be covered with a second layer, is freed of any oxidizing material before the vacuum vapor-deposition occurs. In this manner, the conductivity of the first layer remains constant and does not change so that the blocking ability of the ultimately attained hetero-junction is not negatively influenced.

In a preferred embodiment of the invention, during the vacuum vapor-deposition, the first layer and the container filled with the material to be vaporized are so positioned as not to be directly opposite one another, particularly by means of a bypass so that any cadmium particle or the like generated during sintering cannot directly, i.e., rectilinearly, reach the first layer.

In a preferred embodiment of the invention, the vaporization rate is controlled so as to range between about 1 and 10 Å/sec. and most preferably is controlled to be at about 5 Å/sec.

In preferred embodiments of the invention, the first layer is composed of tin oxide ($SnO_x$, with x being equal to a numeral less than 2) which is doped with sufficient antimony to achieve $n^+$-conductivity.

Double layers produced in accordance with the principles of the invention are useful as the blocking layer/photo-conductor/target means of a camera tube.

For such use, the first layer is preferably deposited in a thickness in a range of about 500 Å to 2000 Å and preferably at about 1000 Å while the second layer is deposited in a thickness ranging between about 1.5 μm and 2.5 μm and most preferably at about 2 μm.

Double layers produced in accordance with the principles of the invention are useful not only for camera tubes but also are generally useful as part of a conversion system of a camera device, for example, of an optical image transducer which consists of a photo-conductive system and a liquid crystal layer as the light modulator and other like devices.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

I claim as my invention:

1. A method of producing a double layer having a hetero-junction for a storage electrode of a camera device comprising:

providing a first layer composed of a transparent semiconductor material having $n^+$-conductivity on a substrate;

admixing at least one glass additive material consisting essentially of boron oxide with a cadmium material selected from the group consisting of cadmium selenide and cadmium sulfo-selenide and sintering the resultant admixture in a vacuum under a thermal treatment at a temperature ranging between about 750° C. to 850° C. so as to prevent substantially any metallic cadmium generated during said thermal treatment from precipitating onto a free surface of said first layer; and initiating vacuum vapor-deposition of said cadmium material onto said free surface of said first layer at a temperature ranging between about 700° C. and 750° C.

2. A method as defined in claim 1 wherein said thermal treatment begins at a temperature of 800° C.

3. A method as defined in claim 1 wherein said glass additive material is added to said cadmium material in an amount ranging between about 0.1 and 1 weight percent, based on the total weight of said cadmium material.

4. A method as defined in claim 1 wherein said free surface of said first layer is freed of any oxidizing materials before the vacuum vapor-deposition.

5. A method as defined in claim 1 wherein the vapor-deposition rate is in the range between about 1 and 10 Å/sec.

6. A method as defined in claim 5 wherein the vapor-deposition rate is 5 Å/sec.

7. A method as defined in claim 1 wherein said first layer is composed of a tin oxide ($SnO_x$ wherein x is a numeral less than 2) which is doped with antimony.

8. A target means of a camera tube produced in accordance with the method defined in claim 1.

9. In a method of producing a double layer having a hetero-junction for a storage electrode of a camera device wherein:

(a) a first layer composed of a transparent semiconductor material having $n^+$-conductivity is provided onto a substrate and functions as an electrically conductive signal electrode;

(b) a second layer composed of a photo-conductive cadmium selenide or cadmium sulfo-selenide having n-conductivity is provided onto a free surface of said first layer; and (c) such second layer is deposited by means of vacuum vapor deposition, the improvement comprising:

(d) admixing at least one glass additive material consisting essentially of boron oxide with a cadmium material to be vapor-deposited;

(e) sintering the resultant admixture in a vacuum at a select temperature so as to prevent substantially any metallic cadmium that may be generated during sintering from precipitating onto a free surface of said first layer; and (f) initiating the vacuum vapor-deposition of the cadmium material at a temperature ranging between about 700° C. and 750° C.

10. In a method as defined in claim 9 wherein sintering at step (e) occurs at a temperature ranging between about 750° C. to 850° C.

11. In a method as defined in claim 9 wherein sintering at step (e) occurs at a temperature of about 800° C.

12. In a method of producing a double layer having a hetero-junction for a storage electrode of a camera device wherein:

(a) a first layer composed of a transparent semiconductor material having $n^+$-conductivity is provided onto a substrate and functions as an electrically conductive signal electrode;

(b) a second layer composed of a photo-conductive cadmium selenide or cadmium sulfo-selenide having n-conductivity is provided onto a free surface of said first layer; and (c) such second layer is deposited by means of vacuum vapor deposition, the improvement comprising:

(d) admixing at least one glass additive material consisting essentially of boron oxide with a cadmium material to be vapor-deposited;

(e) sintering the resultant admixture in a first system under vacuum at a select temperature so as to prevent any metallic cadmium that may be generated during sintering from precipitating onto a free surface of said first layer; and (f) conducting said vacuum vapor-deposition of the cadmium material at a temperature ranging between about 700° C. and 750° C. in a second system under vacuum separate from said first system.

* * * * *